United States Patent
Kim et al.

(10) Patent No.: US 6,326,322 B1
(45) Date of Patent: Dec. 4, 2001

(54) METHOD FOR DEPOSITING A SILICON NITRIDE LAYER

(75) Inventors: Ki-Young Kim, Kyonggi-do; Kyung-Ho Hyun, Seoul; Joong-Il An, Kyonggi-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/697,509

(22) Filed: Oct. 27, 2000

(30) Foreign Application Priority Data

Oct. 29, 1999 (KR) .................................................. 99-47490

(51) Int. Cl.[7] .................................................. H01L 21/31
(52) U.S. Cl. .................................................. 438/791
(58) Field of Search .................................. 438/778, 786, 438/791, 792, 795

(56) References Cited

U.S. PATENT DOCUMENTS

| | | | |
|---|---|---|---|
| 4,877,651 | 10/1989 | Dory | 427/255 |
| 5,629,043 * | 5/1997 | Inaba et al. | 427/79 |
| 6,090,686 * | 7/2000 | Brady et al. | 438/439 |
| 6,147,013 * | 11/2000 | Sun et al. | 438/791 |
| 6,171,977 * | 1/2001 | Kasai et al. | 438/775 |

\* cited by examiner

Primary Examiner—David Nelms
Assistant Examiner—Quoc Hoang
(74) Attorney, Agent, or Firm—Volentine Francos, PLLC

(57) ABSTRACT

The present invention relates to a method for depositing a silicon nitride layer in which a $NH_3$ treatment is performed in a LPCVD chamber having a high pressure valve under operational conditions of high pressure and low temperature. This has the effect of shortening a total operational time required for the $NH_3$ treatment without any decrease in the effectiveness of nitridation. It can also prevent a loss in the operational time in the process of depositing a silicon nitride layer. The method includes the steps of: placing a wafer having an oxide layer in an LPCVD chamber having a high pressure valve under operational conditions of high pressure (for instance, 5~300 Torr) and low temperature (for instance, 670±50° C.); performing an $NH_3$ treatment on the wafer; and depositing a silicon nitride layer on the wafer at the same temperature as the $NH_3$ treatment is performed at.

5 Claims, 3 Drawing Sheets

METHOD FOR DEPOSITING A SILICON NITRIDE LAYER

This application relies for priority upon Korean Patent Application No. 99-47490, filed on Oct. 29, 1999, the contents of which are herein incorporated by reference in their entirety.

BACKGROUND OF THE INVENTION

The present invention relates to a method for depositing an insulating layer in a low pressure chemical vapor deposition (hereinafter referred to as LPCVD) chamber having a high pressure valve. More particularly the present invention relates to a method for performing an $NH_3$ treatment under operational conditions of high pressure and low temperature as a pre-treatment prior to a process of depositing a silicon nitride layer, to thereby prevent a loss in total operation time.

In general, a silicon nitride layer has been widely used as a gate dielectric, a diffusion mask, or a passivation film for highly integrated circuits due to its high dielectric strength, superior barrier properties to impurity diffusion, and favorable chemical stability.

An $NH_3$ treatment has also often been carried out as a pretreatment step prior to a process of depositing a silicon nitride layer $Si_3N_4$ from a natural oxide layer $SiO_2$ grown onto a wafer. The $NH_3$ treatment is usually performed under operational conditions of high temperature (e.g., around 780° C.) and low pressure (e.g., around 0.03 Torr). If the pre-treatment is performed at a temperature lower than 780° C., then the nitridation of the lower layer (e.g., a natural oxide layer) is not effectively accomplished, which can result in inadequate deposition of a silicon nitride layer.

FIGS. 1a and 1b are graphs illustrating changes in the operational conditions during the process of depositing a silicon nitride layer when a conventional $NH_3$ treatment is performed. In particular, FIG. 1a is a graph illustrating changes of temperature based on elapsed time in a process chamber; and FIG. 1b is a graph illustrating changes of pressure based on elapsed time in the chamber. With reference to the accompanying drawings, a conventional method for depositing a silicon nitride layer has been divided into four steps as follows.

At step one (I), a wafer is loaded into a boat, which is in turn placed into an LPCVD chamber at a stand-by temperature (e.g., 550° C.). At this time, the internal pressure of the chamber is set to remain at a specific pressure (e.g., 760 Torr). The chamber used in this process is preferably designed to allow the internal pressure to be controlled a range of at least 760 Torr to less than about 2.25 Torr (most preferably down to about 0.0 Torr).

At step two (II), in order to bring the internal part of the chamber to a high vacuum state, the chamber is pumped to a low pressure and set at a temperature of up to 780° C. The internal pressure of the chamber is preferably lowered to about 0.0 Torr with its temperature being raised up as high as 780° C. This has the effect of releasing any gas (e.g., vapor) that remains in the chamber. Afterwards, the internal pressure of the chamber is increased up to about 0.3 Torr, a pressure necessary for the $NH_3$ treatment, and the $NH_3$ treatment is carried out.

At step three (III), the internal temperature of the chamber is then lowered to a temperature as low as 670° C., and the internal pressure of the chamber is set as high as 0.18 Torr, a pressure necessary for the formation of a silicon nitride layer. Then, under these operational conditions (low temperature of 670° C. and low pressure of 0.18 Torr), a silicon nitride layer is deposited.

At step four (IV), after complete deposition of the silicon nitride layer, the internal pressure of the chamber is again lowered to about 0.0 Torr to release any gas remaining in the chamber. Then, the internal temperature of the chamber is lowered to 550° C., i.e., the initial temperature, and the internal pressure of the chamber is raised back up to 760 Torr, i.e., the initial pressure. At this time, all the processes required for depositing a silicon nitride layer have been completed.

However, if a silicon nitride layer is formed using the aforementioned operational conditions, the silicon nitride deposition method may experience the following problems.

It has been known that the $NH_3$ treatment is carried out as a pretreatment for the nitridation of a lower layer (e.g., a natural oxide layer formed on a wafer). However, if the pretreatment is performed at the same temperature as the process of forming a silicon nitride layer (670° C. in this example), a nitriding of the lower layer can not be effectively accomplished to a desired extent. Under such parameters, an inadequate deposition level of a silicon nitride layer ill occur. Thus, it is currently necessary to perform the $NH_3$ treatment at a high temperature of approximately 780° C. to enhance the effectiveness of the nitridation.

However, If the $NH_3$ treatment is carried out at a high temperature of 780° C., the gas molecules remaining in the chamber can be activated in the course of raising the internal temperature of the chamber from its stand-by temperature of 550° C. up to 780° C. As a result, this increases the pumping time taken to lower the internal pressure of the chamber to its basic vacuum state of about 0.0 Torr before the $NH_3$ treatment.

In addition, since the internal temperature of the chamber (e.g., 780° C.) is higher for the $NH_3$ treatment than for the process of depositing a silicon nitride layer (e.g., 670° C.), a sufficiently long period of time is required to decrease the internal temperature of the chamber from 780° C. to 670° C. between these processes. This undesirably increases the operational time required in total for all the processes for depositing the silicon nitride layer.

Since, such a loss in the total operation time may result in reduction in productivity, there is an urgent demand for solving these problems.

SUMMARY OF THE INVENTION

It is therefore an object of the present invention to solve the aforementioned problems and provide a method for depositing a silicon nitride layer in which the $NH_3$ treatment is performed in a LPCVD chamber having a high pressure valve under the operational conditions of high pressure and low temperature. This can reduce the total operation time required for the $NH_3$ treatment without decreasing the effectiveness of nitridation and while preventing a loss in the operation time for the silicon nitride layer deposition.

In order to accomplish the aforementioned object, there is provided a method for depositing a silicon nitride layer comprising placing a wafer having an oxide layer in an LPCVD chamber that is maintained at a high pressure and a low temperature; performing an $NH_3$ treatment on the wafer; and depositing a silicon nitride layer on the wafer. The performance of the $NH_3$ treatment and the deposition of the silicon nitride layer are both carried out at the same high pressure and low temperature. The high pressure may be maintained through the use of a high pressure valve.

The low temperature is preferably within a range of 670±50° C., most preferably at 670° C. The high pressure is preferably within a range 5~300 Torr, most preferably at 5 Torr. The oxide layer is preferably a natural oxide layer.

If the silicon nitride layer is deposited under the same operational conditions as the NH$_3$ treatment is performed under, i.e. under a high pressure and at a low temperature (e.g., at a pressure of 5~300 Torr and temperature of 670±50° C.), it is possible to reduce the pumping time taken for lowering down the internal pressure of the chamber to the basic vacuum state of 0.0 Torr. This occurs because the NH$_3$ treatment is carried out in operational conditions of high pressure and low temperature (e.g., a pressure of 5~300 Torr and temperature of 670±50° C.).

In addition, since the temperature applied in the NH$_3$ treatment is the same as in the process of depositing a silicon nitride layer, it is not necessary to control the internal temperature of the chamber after the NH$_3$ treatment, which can reduce the total operation time for the process of depositing a silicon nitride layer.

BRIEF DESCRIPTION OF THE DRAWINGS

Objects and aspects of the invention will become apparent from the following description of embodiments with reference to the accompanying drawings in which.

DETAILED DESCRIPTION OF THE PRESENT INVENTION

Objects and aspects of the present invention will become apparent from the following detailed description of a preferred embodiment with reference to the accompanying drawings.

Figure 2A:
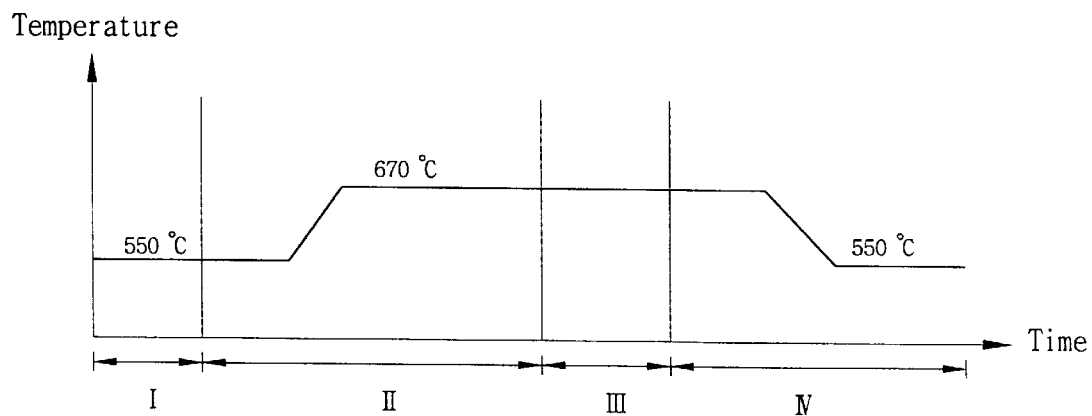
FIG. 2a is a graph illustrating changes of temperature based on elapsed time in a chamber during the process of depositing a silicon nitride layer when an NH$_3$ treatment is performed by a method according to a preferred embodiment of the present invention.
Figure 2B:
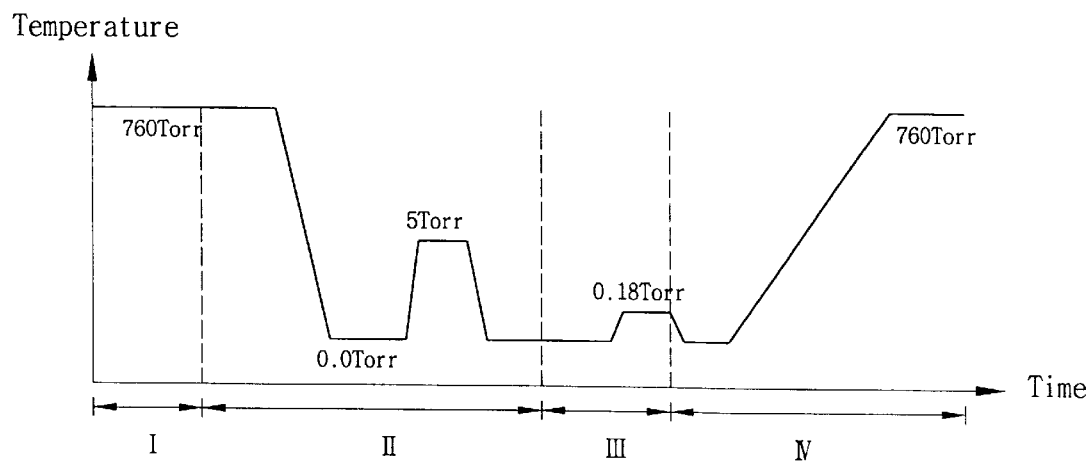
FIG. 2b is a graph illustrating changes of pressure based on elapsed time in a chamber during the process of depositing a silicon nitride layer when an NH$_3$ treatment is performed by a method according to a preferred embodiment of the present invention.

FIGS. 2a and 2b are graphs illustrating changes of operational conditions in the process of depositing a silicon nitride layer when an NH$_3$ treatment is performed according to a preferred embodiment of the present invention. In particular, FIG. 2a is a graph illustrating changes of temperature based on elapsed time in the chamber, while FIG. 2b is a graph illustrating changes of pressure along with time in the chamber.

With reference to the accompanying drawings, a method is provided for depositing a silicon nitride layer according to a preferred embodiment of the present invention. This method preferably includes four steps, as follows.

In step one (I), a wafer is loaded into a boat, which is then placed into an LPCVD chamber at its stand-by state of temperature (e.g., about 550° C.). At this time, the internal pressure of the chamber is set and preferably kept at about 760 Torr. The LPCVD chamber preferably has a high pressure valve to control its internal pressure within a wide range from about 0.0 Torr to about 1000 Torr. Such chambers are well known in the art, and so no further description about the LPCVD chamber with a high pressure valve will be provided. Such devices have been widely used for various deposition processes.

During step two (II), in order to bring the internal part of the chamber to a high vacuum state, a low pressure pumping process is performed and the internal temperature of the chamber is raised, preferably to about 670° C. In accordance with a preferred embodiment of the present invention, the internal temperature of the chamber is then maintained at 670° C. as shown in FIG. 2a. However, in alternate embodiments the temperature may be varied within the range of about 670±50° C.

During this step, the internal pressure of the chamber is lowered, preferably to bout 0.0 Torr, while the temperature is kept at 670° C. This has the effect of releasing any gas remaining in the chamber. Afterwards, the internal pressure of the chamber is raised up to about 5.0 Torr, i.e., the pressure required for the NH$_3$ treatment. Although in this embodiment the internal pressure of the chamber is maintained at 5.0 Torr as shown in FIG. 2b, it is possible to apply any level of pressure within the range of about 5.0 to 300 Torr.

The NH$_3$ treatment is then carried out under the aforementioned operational conditions (i.e., a low temperature of 670° C. and a high pressure of at least 5.0 Torr). After the completion of the NH$_3$ treatment, the internal pressure of the chamber is lowered back to about 0.0 Torr while the temperature is kept at 670° C. Once again, this is done to release any gas remaining in the chamber.

At step three (III), the internal pressure of the chamber is raised, preferably to about 0.18 Torr, i.e., the pressure required for the silicon nitride layer deposition process, while the internal temperature of the chamber is kept at about 670° C. Under these operational conditions, a silicon nitride layer is then deposited.

At step four (IV), after depositing the silicon nitride layer, the internal pressure of the chamber is lowered back to about 0.0 Torr to release any gas remaining in the chamber. Then, the internal temperature of the chamber is lowered to its initially set value, 550° C. in the preferred embodiment, and the internal pressure of the chamber is raised to about 760 Torr. At this point, all of the steps for depositing a nitride layer have been completed.

If the silicon nitride layer is deposited in this manner, the NH$_3$ treatment will have been carried out under high pressure and low temperature (e.g., at a pressure of about 5~300 Torr and at a temperature of 670±50° C.), not under low pressure and high temperature (e.g., a pressure of 0.3 Torr and temperature of 780° C.). Because of this, the pumping time required to lower the internal pressure of the chamber to 0.0 Torr, its basic vacuum state, can be shortened in the method of the present invention.

Compare this to the conventional method, which requires the operational conditions of low pressure and high temperature for the NH$_3$ treatment. Using the present invention, the temperature required for the NH$_3$ treatment drops from 780° C. to 670±50° C. degree, effectively suppressing the activation of any gas molecules that remain in the chamber.

Furthermore, in the preferred embodiment, the temperature condition required for the NH$_3$ treatment is the same as in the process of depositing the silicon nitride layer. As a result, there is no need to lower the internal temperature of the chamber after the completion of the $NH_3$ treatment, which reduces the operation time for the processes of depositing a silicon nitride layer, by eliminating a temperature changing step. In other words, there is an improvement in productivity because it becomes possible to make a significant reduction in the total operational time required to perform all of the steps of depositing a silicon nitride layer.

In addition, it has been confirmed by experimentation that the total operation time taken for all of the processes of depositing the silicon nitride layer under the aforementioned operational conditions of the present invention is shortened by approximately 72 minutes as compared with the conventional method.

Figure 3:
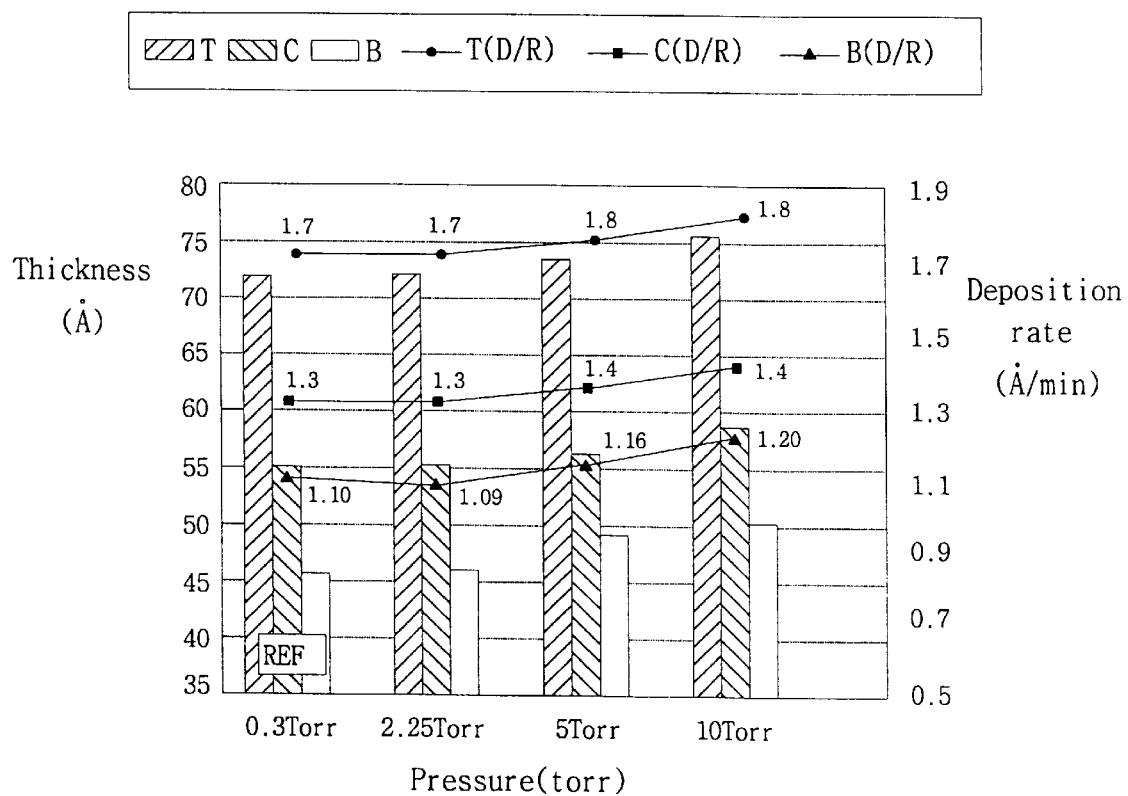
FIG. 3 is a graph illustrating a comparison of average deposition levels of silicon nitride layers that are respectively formed under the operational conditions of FIGS. 1a and 1b and FIGS. 2a and 2b.

It is also confirmed that the nitridation of the $NH_3$ treatment is more effectively accomplished under the aforementioned operational conditions of the present invention than under the high temperature of 780° C. used in the conventional method. FIG. 3 shows the results of an experiment that proves the effectiveness of nitridation according to the preferred embodiment of the present invention.

FIG. 3 is a graph illustrating a comparison of the average deposition levels of silicon nitride layers that are respectively formed under the operational conditions of FIGS. 1a and 1b and FIGS. 2a and 2b. Generally, nitridation is known to be proportional to the deposition level of a silicon nitride layer. In FIG. 3, the deposition level of silicon nitride layer is compared and evaluated according to changes in the internal pressure of a chamber in the course of the $NH_3$ treatment.

In the graph in FIG. 3, the part designated by the label REF indicates the level of the silicon nitride layer deposited by an $NH_3$ treatment that has been carried out under conventional operational conditions, i.e., at a low pressure of about 0.3 Torr and at a high temperature of about 780° C. The remaining symbols of the graph indicate the levels of the silicon nitride layer deposited by an $NH_3$ treatment that has been carried out under the operational conditions according to preferred embodiments of the present invention, i.e., at a high pressure of over 2.5 Torr and at low temperature of about 670° C.

Reference symbols T, C, and B respectively designate the thickness of a silicon nitride layer deposited at the top, center and bottom parts of the LPCVD chamber. Furthermore, reference symbols T(D/R), C(D/R) and B(D/R) respectively designate thickness of a silicon nitride layer deposited per minute at the top, center and bottom parts of the LPCVD chamber.

As shown in the graph, the deposition level of the silicon nitride layer is measured to be 1.7, 1.3 and 1.10 for respective zones of the chamber (i.e., top, center, and bottom parts of the LPCVD chamber) under the conventional operational conditions of low pressure and high temperature (0.3 Torr, 780° C.).

In contrast, if the temperature and pressure are respectively set at 670° C. and 5 Torr or above, the deposition level of the silicon nitride layer increases for all zones of the chamber as compared to the conventional method (REF). In other words, under the same temperature of 670° C., the deposition level of the silicon nitride layer for respective zones of the chamber is measured to be 1.8, 1.4, and 1.16 if the internal pressure of the chamber is 5 Torr, and to be 1.8, 1.4, and 1.20 if the internal pressure is 10 Torr.

Figure 1A:
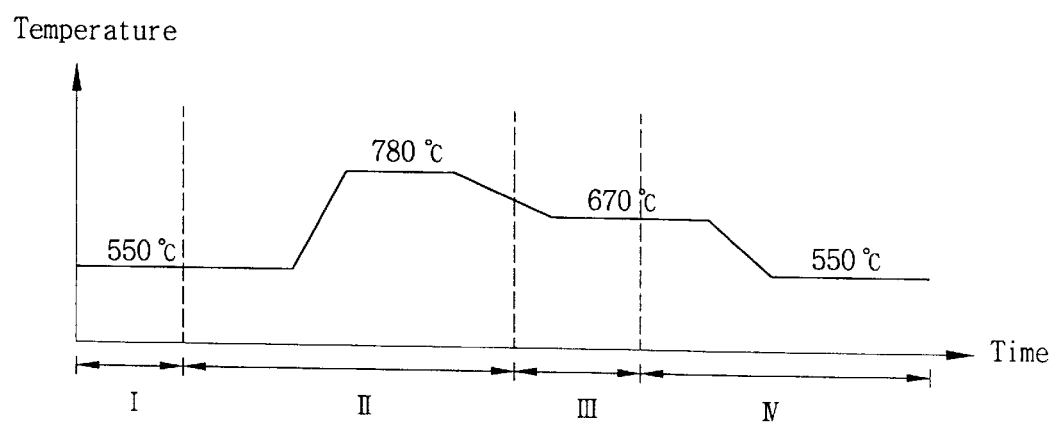
FIG. 1a is a graph illustrating changes of temperature based on elapsed time in a chamber during the process of depositing a silicon nitride layer when an NH$_3$ treatment is performed by a conventional method.
Figure 1B:
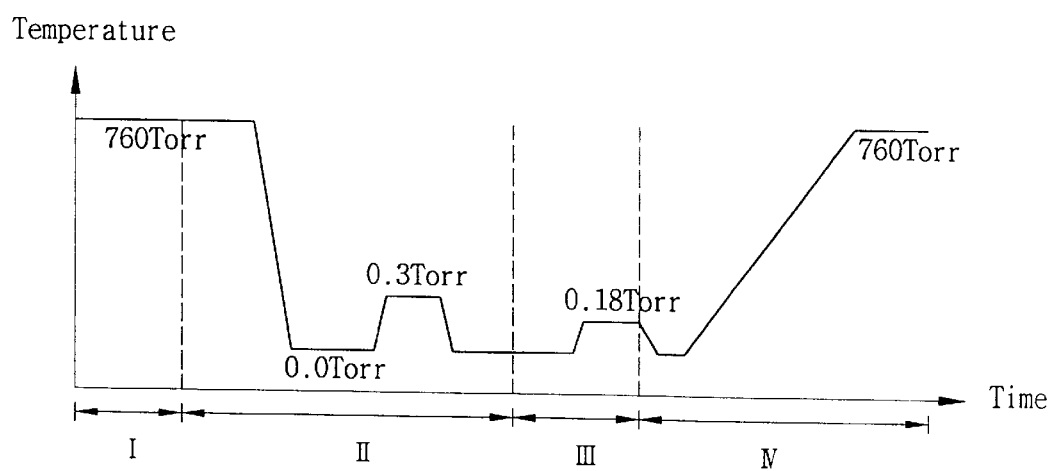
FIG. 1b is a graph illustrating changes of pressure based on elapsed time in a chamber during the process of depositing a silicon nitride layer when an NH$_3$ treatment is performed by a conventional method.

Referring to these experimental results, it can be seen that the deposition level of the silicon nitride layer is more effective under the operational conditions of FIGS. 2a and 2b than those of FIGS. 1a and 1b.

Thus, nitridation for depositing a silicon nitride layer has been found to be more effective according to the preferred embodiment of the present invention, and results in a higher dielectric effect when used in the processes of fabricating a semiconductor device (particularly, a capacitor). This allows the process to make the dielectric layer thin and obtain an additional effect of making a progress in breakdown voltage (BV) of a capacitor.

While the invention has been described in terms of a preferred embodiment, those skilled in the art will recognize that the invention can be practiced with modifications within the spirit and scope of the appended claims.

As described above, The preferred embodiment of the present invention provides an advantage in that the $NH_3$ treatment that is performed prior to a process of depositing a silicon nitride layer takes place in a LPCVD chamber having a high pressure valve under the operational conditions of high pressure and low temperature. This can shorten the total operational time required for the $NH_3$ treatment without decreasing the effectiveness of nitridation. In can also prevent a loss in the operation time in all the steps of depositing a silicon nitride layer.

What is claimed is:

1. A method for depositing a silicon nitride layer, comprising:
   placing a wafer having an oxide layer in an LPCVD chamber that is maintained at a high pressure and low temperature;
   performing an $NH_3$ treatment on the wafer; and
   depositing a silicon nitride layer on the wafer,
   wherein said performing an $NH_3$ treatment and said depositing a silicon nitride layer are carried out at a low temperature within a range of 670±50° C., and wherein said performing an $NH_3$ treatment is carried out at a high pressure within a range of 5~300 Torr.

2. A method for depositing a silicon nitride layer, as recited in claim 1, wherein the high pressure is maintained through the use of a high pressure valve.

3. A method for depositing a silicon nitride layer, as recited in claim 1, wherein the low temperature is 670° C.

4. A method for depositing a silicon nitride layer, as recited in claim 1, wherein the high pressure is 5 Torr.

5. A method for depositing a silicon nitride layer, as recited in claim 1, wherein the oxide layer is a natural oxide layer.

* * * * *